United States Patent
Benedict

(10) Patent No.: US 9,690,505 B2
(45) Date of Patent: Jun. 27, 2017

(54) REFRESH ROW ADDRESS

(71) Applicant: HEWLETT PACKARD ENTERPRISE DEVELOPMENT LP, Houston, TX (US)

(72) Inventor: Melvin K. Benedict, Magnolia, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/912,502

(22) PCT Filed: Sep. 27, 2013

(86) PCT No.: PCT/US2013/062233
§ 371 (c)(1),
(2) Date: Feb. 17, 2016

(87) PCT Pub. No.: WO2015/047304
PCT Pub. Date: Apr. 2, 2015

(65) Prior Publication Data
US 2016/0202926 A1    Jul. 14, 2016

(51) Int. Cl.
| | | |
|---|---|---|
| G11C 11/40 | (2006.01) |
| G11C 7/02 | (2006.01) |
| G06F 3/06 | (2006.01) |
| G11C 11/408 | (2006.01) |
| G06F 12/123 | (2016.01) |
| G11C 11/406 | (2006.01) |

(52) U.S. Cl.
CPC .......... *G06F 3/0619* (2013.01); *G06F 3/0653* (2013.01); *G06F 3/0673* (2013.01); *G06F 12/123* (2013.01); *G11C 7/02* (2013.01); *G11C 11/408* (2013.01); *G11C 11/40611* (2013.01); *G06F 2212/69* (2013.01); *G11C 2211/4065* (2013.01)

(58) Field of Classification Search
CPC ........................... G11C 7/02; G11C 11/40611
See application file for complete search history.

(56) References Cited

U.S. PATENT DOCUMENTS

| | | |
|---|---|---|
| 5,410,545 A | 4/1995 | Porter et al. |
| 6,061,290 A | 5/2000 | Shirley |
| 8,164,941 B2 | 4/2012 | Kang et al. |

(Continued)

OTHER PUBLICATIONS

Fischer, et al, "FPGA Design for DDR3 Memory," < http://www.wpi.edu/Pubs/E-project/Available/E-project-031212-183607/unrestricted/FPGA_Design_for_DDR3_Memory.pdf >, Mar. 12, 2012 (135 pages).

(Continued)

*Primary Examiner* — Edward Dudek, Jr.
(74) *Attorney, Agent, or Firm* — Hewlett Packard Enterprise Patent Department

(57) ABSTRACT

A table may include first and second row addresses that are adjacent an activated row address. A first counter of the first row address may be incremented if the activated row address is not included in the table. A second counter of the second row address may also be incremented if the activated row address is not included in the table. The first row address may be refreshed if the first counter exceeds a counter threshold. The second row address may be refreshed if the second counter exceeds the counter threshold.

15 Claims, 7 Drawing Sheets

(56) References Cited

U.S. PATENT DOCUMENTS

| | | |
|---|---|---|
| 2007/0030746 A1 | 2/2007 | Best et al. |
| 2009/0268539 A1 | 10/2009 | Ruckerbauer et al. |
| 2011/0069572 A1 | 3/2011 | Lee et al. |
| 2012/0151131 A1 | 6/2012 | Kilmer et al. |
| 2013/0003467 A1 | 1/2013 | Klein |
| 2013/0268727 A1* | 10/2013 | Sohn .................... G11C 8/00 711/105 |
| 2013/0326162 A1* | 12/2013 | Moon ................ G06F 12/00 711/154 |
| 2014/0095780 A1* | 4/2014 | Bains .................. G11C 11/406 711/105 |
| 2014/0177370 A1* | 6/2014 | Halbert ............ G11C 11/40603 365/222 |
| 2014/0189228 A1* | 7/2014 | Greenfield ........ G11C 11/40607 711/106 |
| 2016/0246525 A1* | 8/2016 | Jeffrey ................. G11C 7/02 |

OTHER PUBLICATIONS

International Searching Authority, The International Search Report and the Written Opinion for PCT/US2013/062233 dated Jun. 10, 2014, 9 Pages.

* cited by examiner

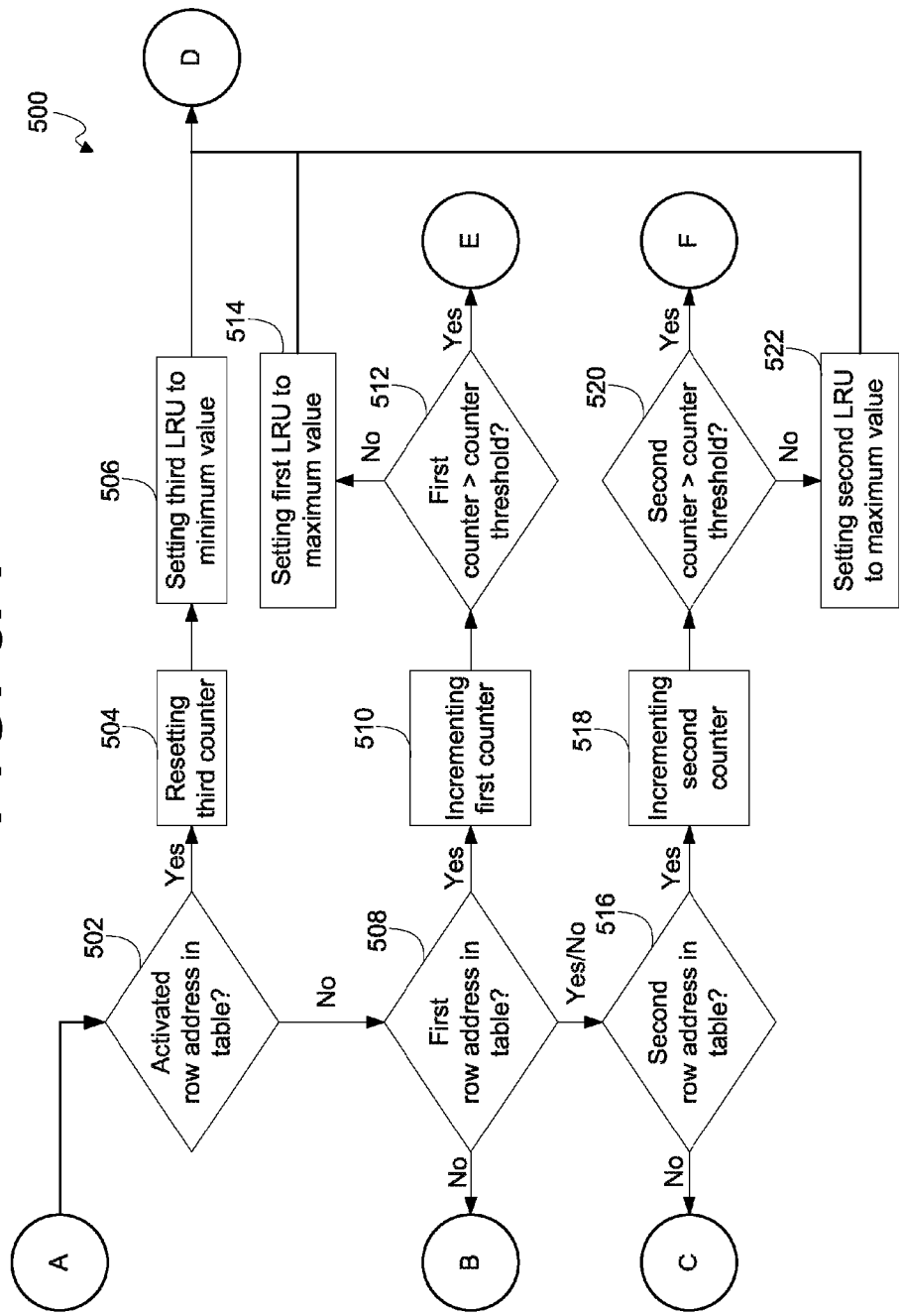

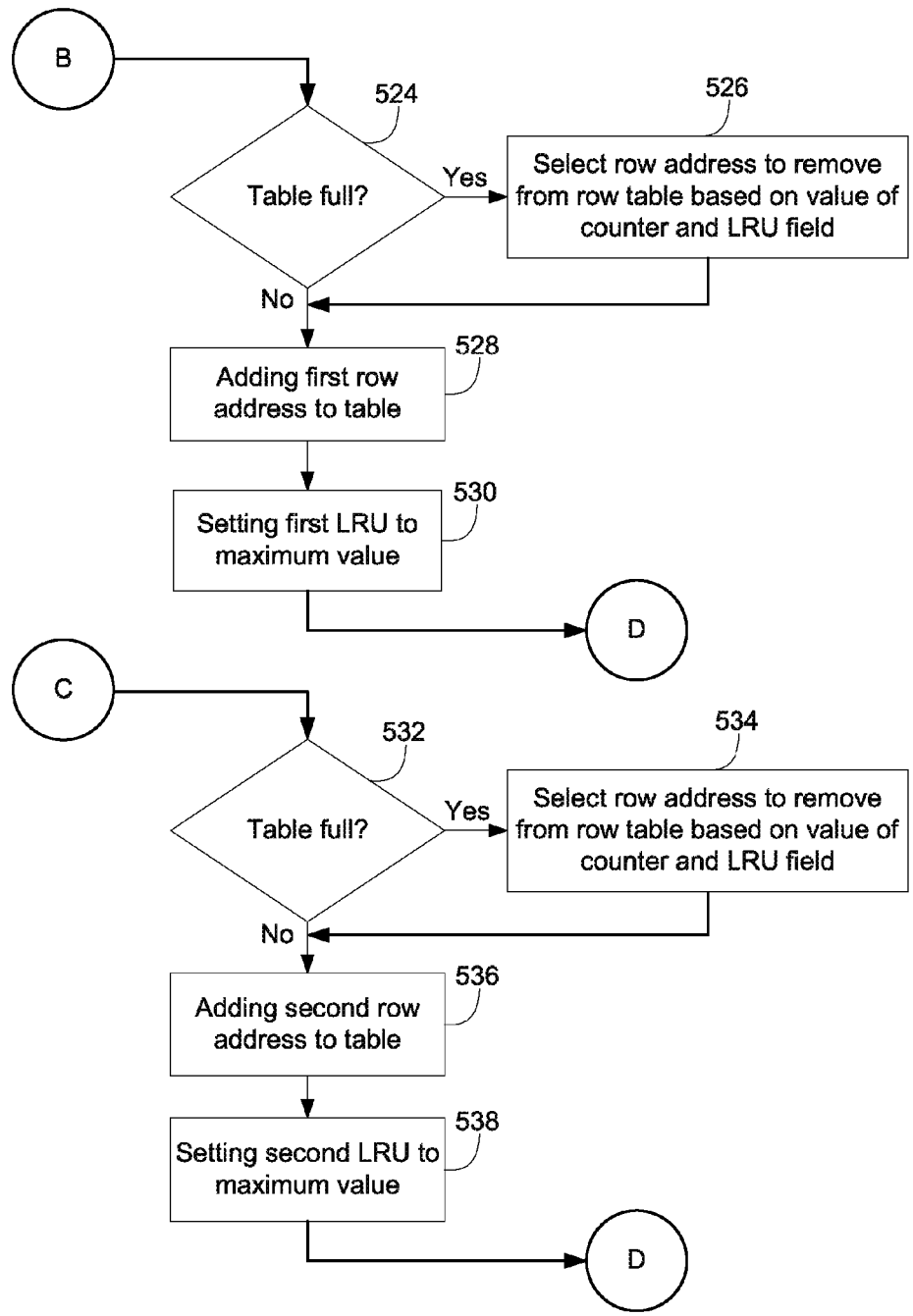

REFRESH ROW ADDRESS

BACKGROUND

A memory may receive commands to access a memory location of the memory. For instance, a Dynamic random access memory (DRAM) may receive an activate command to open a row address of the DRAM to a read or write operation. Manufacturers, vendors and/or suppliers are challenged to provide users with more accurate methods for ensuring that data at the memory is not corrupted.

BRIEF DESCRIPTION OF THE DRAWINGS

The following detailed description references the drawings, wherein:

FIGS. 5A to 5D is another example flowchart of a method for refreshing a row address if a counter threshold is exceeded.

DETAILED DESCRIPTION

Figure 1:
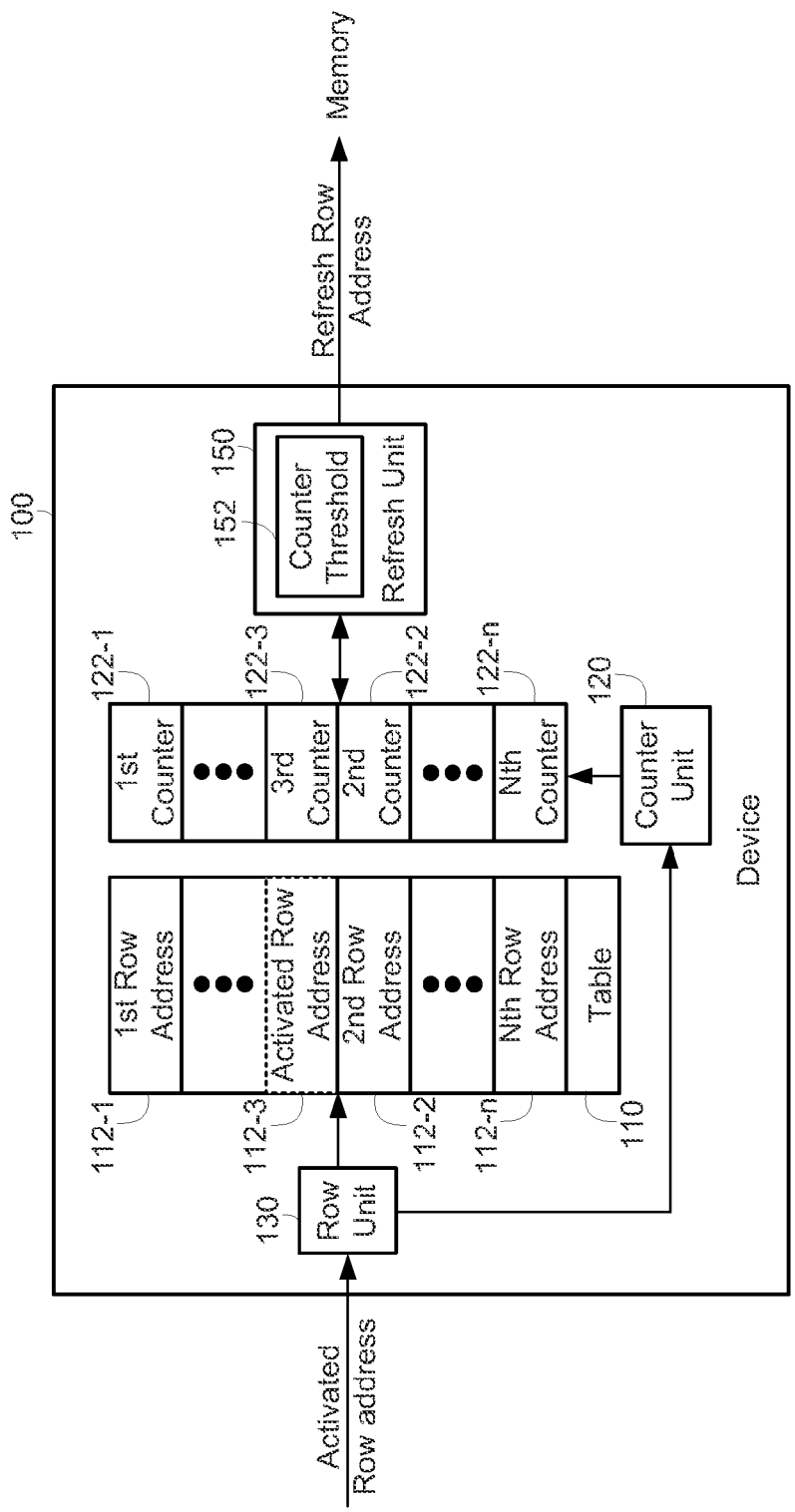
FIG. 1 is an example block diagram of a device to refresh a row address if a counter threshold is exceeded.

Specific details are given in the following description to provide a thorough understanding of embodiments. However, it will be understood that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Dynamic random access memory (DRAM) technology and processes have developed to the point where fault mechanisms which were considered second order affects may be fundamental fault mechanisms in today's DRAMs. One such mechanism is known as word-line disturb, which may occur when activate commands are repeatedly issued to a single or small group of row addresses. The activate command may open a row address to a memory access.

These repeated accesses to the same one or more row addresses may affect the contents of physically adjacent word-lines, thus causing silent or soft errors in data stored therein. For example, a sufficiently large number of repeated accesses in a short time may cause electrical or magnetic interference to adjacent physical row addresses, causing one or more bits of a storage element to spontaneously flip to an opposite state. Memory controllers and memories that communicate via a double data rate (DDR) mechanism may allow for a burst of accesses to a same row address during a short time period.

Examples may provide a mechanism for detecting when a either one or two physically adjacent rows of a word-line are being "hammered" or used at a high rate. In turn, a corrective action, such as a refresh, may be triggered to prevent or reduce a likelihood of future data errors to the physically adjacent rows. An example device may include a table, a plurality of counters, a row unit, a counter unit and a refresh unit. The table may store a plurality of row addresses, including first and second row addresses, of a memory. The plurality of counters may include first and second counters.

Each of the counters may correspond to one of the row addresses of the table. The row unit may determine if an activated row address of the memory is included in the table. The counter unit may increment at least one of the first counter of the first row address and the second counter of the second row address, if the activated row address is not included in the table. The refresh unit may refresh at least one of the first and second row addresses if at least one of the first and second counters exceeds a counter threshold. At least one the first and second row addresses may be adjacent to the activated row address.

Thus, examples may prevent data loss by counting adjacent row address activates and taking a corrective action, such as refresh of a victimized row, when the aggressor row is "hammered" or accessed too much. Further, examples may be readily customized to different types of memory array structures without requiring special memory commands.

Referring now to the drawings, FIG. 1 is an example block diagram of a device 100 to refresh a row address if a counter threshold is exceeded. The device 100 may interface with or be included in any type of device including a memory and/or a controller, such as a DRAM, a memory controller, a notebook computer, a desktop computer, an all-in-one system, a server, a network device, a wireless device, a storage device, a mobile device, a thin client, a retail point of sale device, a gaming device, a scientific instrument, and the like.

In FIG. 1, the device 100 is shown to include a table 110, a counter unit 120, a plurality of counters 122-1 to 122-$n$ (where n is a natural number), a row unit 130 and a refresh unit 150. The counter, refresh and row units 120, 150 and 130 may include, for example, a hardware device including electronic circuitry for implementing the functionality described below, such as control logic and/or memory. In addition or as an alternative, the counter, refresh and row units 120, 150 and 130 may be implemented as a series of instructions encoded on a machine-readable storage medium and executable by a processor.

The table 110 and plurality of counters 120-1 to 120-$n$ may include or be stored upon be any electronic, magnetic, optical, or other physical storage device, such as Random Access Memory (RAM), a storage drive, and the like. For example, table 110 and plurality of counters 120-1 to 120-$n$ may be stored on one or more separate memory components, such as registers and/or a single memory device, like a RAM chip. The table 110 may relate to a data structure for arranging information in rows and/or columns. Here, the table 110 may include a plurality of entries, with each entry storing a row address 112. Each of the counters 120 may be a separate locations, either logical or physical, to store a numerical value.

The table 110 may store a plurality of row addresses 112-1 to 112-$n$ of a memory (not shown). For example, a row address may specify a row and/or a row and bank of the memory. Each of the plurality of counters 122-1 to 122-$n$ may correspond to one of the row addresses of the table 110. For example, if the table 110 may hold 16 entries of row addresses 112-1 to 112-16, then there may be 16 counters 122-1 to 122-6, with each counter 122 assigned to one of the entries of the table 110.

The row unit 130 may determine if an activated row address of the memory is included in the table 110. For example, a processor (not shown) may receive a instruction to access the memory, such as for a read or write operation. Then, an activate command may be issued to open a row of the location to be accessed. An address of the row to be opened in response to the activate command may be referred to as the activated row address.

The counter unit 120 may track a number of times at least one of the rows of the memory is next to a row of the memory that is activated, such as by monitoring the row address(es) of the row(s) preceding and/or following the activated row address in the memory. When the activated row address has been accessed at a substantially high rate, the activated row address may be referred to as the hammered row address, and the row addresses adjacent to the activated row address may be referred to as victim row addresses. The table 110 may be used to track the victim row addresses.

For example, the counter unit 120 may increment a first counter 122-1 of a first row address 112-1 included in the table 110, if the activated row address is not included in the table 110. Similarly, the counter unit 120 may increment a second counter 122-2 of a second row address 112-2 included in the table 110, if the activated row address is not included in the table 110. Thus, if the first and second row addresses 112-1 and 112-2 were adjacent to the activated row address and the activated row address was not included in the table 110, the counter unit 120 may increment each of the first and second counters 122-1 and 122-2 by a single unit. For instance, the first counter 122-1 may be incremented from 29 to 30 or the second counter 122-2 may be incremented from 188 to 189. The first and second row addresses 112-1 and 112-2 may be victim row addresses.

The refresh unit 150 may refresh at least one of the first and second row addresses 112-1 and 112-2 if at least one of the first and second counters 122-1 and 122-2 exceeds a counter threshold 152. For example, the refresh unit 150 may refresh the first row address 112-1 if the first counter 122-1 exceeds the counter threshold 152. Also, the refresh unit 150 may refresh the second row address 112-2 if the second counter 122-2 exceeds the counter threshold 152. A value of the counter threshold 152 may be determined experimentally and/or based on a property of the memory. In one instance, the counter threshold 152 may be approximately 300.

Thus, the refresh unit 150 may refresh a victim row address of the table 110 for which one or more adjacent row addresses have been activated numerous times in a time period, such as by more than the counter threshold 150. Further, during this short time period, the victim row address may not have been previously refreshed or activated. The term refresh may refer to a process for preserving the information located at a memory location, such as a row address. A refresh may be carried out numerous ways depending on a memory architecture, such as by a periodic pre-charge, read of and/or rewrite to the memory location.

The counter unit 120 may reset the first counter 122-1 to a minimum value, if the first counter 122-1 exceeds the counter threshold 152. The counter unit 120 may also reset the second counter 122-2 to the minimum value, if the second counter 122-2 exceeds the counter threshold 152. The minimum value may be, for example, 0 or some other low value. Thus, the counter unit 120 may restart a count for a number of times a row address has been victimized after the victimized row is refreshed. Also, the counter unit 120 may add the first and/or second row addresses 112-1 and 112-2 to the table 110 in order to carry out the above counting, if the table 110 does not already include the first and/or second row addresses 112-1 and 112-2 and the activated row address is not included in the table 110. In this case, the counters 122 for these newly added row addresses 112 may be set to the minimum value or the like.

Figure 2:
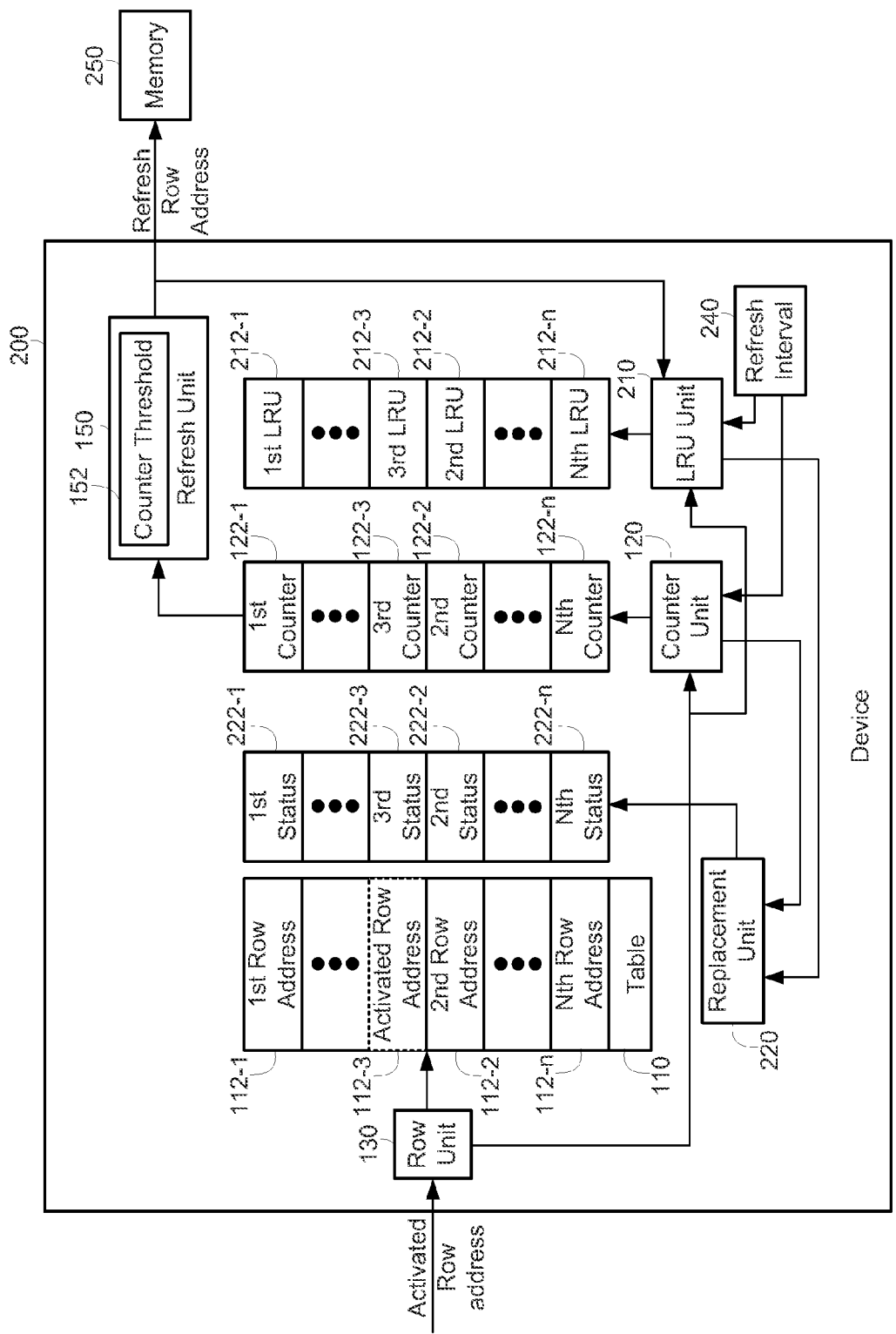
FIG. 2 is another example block diagram of a device to refresh a row address if a counter threshold is exceeded.

FIG. 2 is another example block diagram of a device 200 to refresh a row address if a counter threshold is exceeded. The device 200 may interface with or be included in any type of device including a memory and/or a controller, such as a DRAM, a memory controller, a notebook computer, a desktop computer, an all-in-one system, a server, a network device, a wireless device, a storage device, a mobile device, a thin client, a retail point of sale device, a gaming device, a scientific instrument, and the like.

Here, the device 200 is shown to interface with a memory 250. While FIG. 2 shows the device 200 to be separate from the memory 250, examples may include the device 200 to be integrated with the memory 250 and/or a memory controller (not shown). Example types of the memory 250 may be Random Access Memory (RAM) like synchronous dynamic random-access memory (SDRAM), dynamic random access memory (DRAM), or graphics RAM. Further example types of the memory 250 may include NAND flash memory and main memory. In addition, the memory 250 may have a double data rate (DDR) interface (not shown). The DDR interface may allow the memory 250 to transfer data on both rising and falling edges of a clock signal along a bus. The DDR interface 252 may include any generation of DDR, such as DDR first generation (DDR1) through DDR fourth generation (DDR4).

The device 200 of FIG. 2 may include the functionality and/or hardware of the device 100 of FIG. 1. For example, the device 200 includes the table 110, the counter unit 120, the plurality of counters 122-1 to 122-$n$, the row unit 130 and the refresh unit 150. Further, the device 200 includes a least recently used (LRU) unit, a plurality of LRU fields 212-1 to 212-$n$, a replacement unit 220, a plurality of replacement status fields 222-1 to 222-$n$ and a refresh interval 240.

The LRU and replacement units 210 and 220 may include, for example, a hardware device including electronic circuitry for implementing the functionality described below, such as control logic and/or memory. In addition or as an alternative, the LRU and replacement units 210 and 220 may be implemented as a series of instructions encoded on a machine-readable storage medium and executable by a processor. The plurality of LRU fields 212-1 to 212-$n$, plurality of replacement status fields 222-1 to 222-$n$ and the refresh interval 240 may include or be stored upon be any electronic, magnetic, optical, or other physical storage device, such as Random Access Memory (RAM), a storage drive, and the like.

The device 200 may receive the activated row address and/or intercept an activate command intended for the row address to be activated from a processor, cache, and/or controller (not shown). As noted above, the first and second counters 122-1 and 122-2 are only incremented if the first and second addresses 112-1 and 112-2 are adjacent to the activated row address and the activated row address is not currently included in the table 110. However, if the activated row address 112-3 is included in the table 110, the counter unit 120 may instead reset a third counter 122-3 of the activated row address 112-3 to the minimum value. In this case, the first and second counters 122-1 and 122-2 are not incremented.

The LRU unit 210 may include any type of policy or algorithm to replace a least recently used row address 112 of the table 110. For example, if the table 110 is full and a new row address 112 is to be added to the table 110, the LRU unit 210 may determine which row address 112 of the table to replace. Each of the plurality of LRU fields 212-1 to 212-$n$ may correspond to one of the plurality of row addresses 112-1 to 112-$n$. For example, the LRU unit 210 may set a first LRU field 212-1 of the first row address 112-1 and a second LRU field 212-2 of the second row address 112-2 to a maximum value, if the activated row address is not included in the table 110. The maximum value may depend on a size of the table 110. For example, if the table 110 may hold a maximum of 16 row addresses 112, the maximum value may be 15 or 16.

Further, the LRU unit 210 may set the first LRU field 212-1 of the first row address 112-1 to the minimum value, if the first row address 112-1 is refreshed. Similarly, the LRU unit 210 may set the second LRU field 212-2 of the second row address 112-2 to the minimum value, if second row address 112-2 is refreshed. On the other hand, if the activated row address 112-3 is included in the table 110, the LRU unit 210 may set a third LRU field 212-3 of the activated row address 112-3 to the minimum value. The LRU unit 210 may also decrement all of the LRU fields 212-1 to 212-$n$ each time a row address of the memory 250 is to be activated, such as after setting the first, second and/or third LRU fields 212-1 to 212-3.

Each of the plurality of replacement status fields 222-1 to 222-$n$ may correspond to one of the plurality of row addresses 112-1 to 112-$n$. For example, each of the replacement fields 222 may be a single bit, with a 0 value indicating a reset status and 1 value indicating a set status. The replacement unit 220 may select one of the plurality of row addresses 112-1 to 112-$n$ to have a set replacement status 222, if the selected row address 112 has an LRU field 212 less than the minimum value and corresponds to a counter 122 having a lowest value of the plurality of counters 122-1 to 122-$n$. For example, assume the minimum value is 1 and the first and second row addresses 112-1 and 112-2 of the table 110 have first and second LRU fields 212-1 and 212-2 having the value 0. If the first counter 122-1 has a value of 23 and the second counter 122-2 has a value of 6. The replacement unit 220 may set the second replacement status field 222-2 of the second row address 112-2 to the value 1.

The replacement unit 220 may replace the row address 112 of the table 110 having the a replacement status 222 that is set with at least one of the first and second row addresses 112-1 and 112-2, if the table 110 is full and replacement 220 seeks to add at least one of the first and second row addresses 112-1 and 112-2 to the table 110. For instance, if two row addresses 112 are to be added and the table 110 is full, two row addresses having the set replacement status 222 may be replaced, with the LRU unit 210 to determine which of the row addresses 112 with the LRU field 212 less than the minimum value has a lowest value for its counter 122.

All of the plurality of counters 122-1 to 122-$n$ and the LRU fields 212-1 to 212-$n$ may be reset at an end of a refresh interval 240. The refresh interval 240 may be a interval that, for example, is determined experimentally or set based on characteristics of the memory 250. For example, if the refresh interval 240 is 64 milliseconds (ms), the LRU unit 210 may reset all of the LRU fields 212-1 to 212-$n$ to a default value, such as 0 or 1, every 64 ms. Similarly, the counter unit 120 may reset all of the counters 122-1 to 122-$n$ to the default value, every 64 ms.

Figure 3:
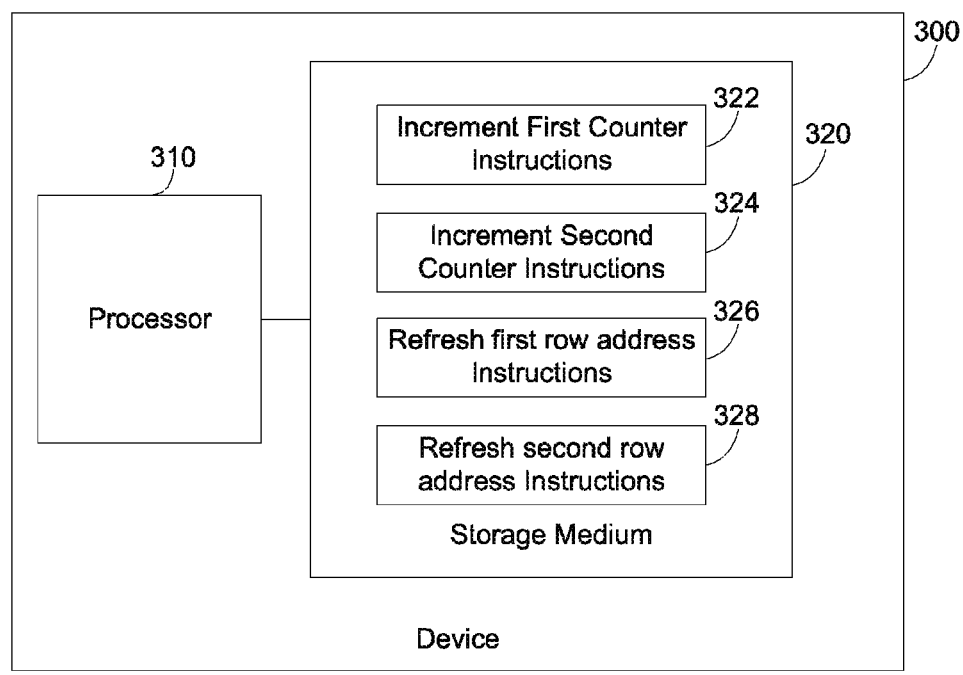
FIG. 3 is an example block diagram of a computing device including instructions for refreshing a row address if a counter threshold is exceeded.

FIG. 3 is an example block diagram of a computing device 300 including instructions for refreshing a row address if a counter threshold is exceeded. In the embodiment of FIG. 3, the computing device 300 includes a processor 310 and a machine-readable storage medium 320. The machine-readable storage medium 320 further includes instructions 322, 324, 326 and 328 for refreshing a row address if a counter threshold is exceeded.

The computing device 300 may be, for example, a secure microprocessor, a notebook computer, a desktop computer, an all-in-one system, a server, a network device, a controller, a wireless device, or any other type of device capable of executing the instructions 322, 324, 326 and 328. In certain examples, the computing device 300 may include or be connected to additional components such as memories, controllers, etc.

The processor 310 may be, at least one central processing unit (CPU), at least one semiconductor-based microprocessor, at least one graphics processing unit (GPU), a microcontroller, special purpose logic hardware controlled by microcode or other hardware devices suitable for retrieval and execution of instructions stored in the machine-readable storage medium 320, or combinations thereof. The processor 310 may fetch, decode, and execute instructions 322, 324, 326 and 328 to implement refreshing the row address if the counter threshold is exceeded. As an alternative or in addition to retrieving and executing instructions, the processor 310 may include at least one integrated circuit (IC), other control logic, other electronic circuits, or combinations thereof that include a number of electronic components for performing the functionality of instructions 322, 324, 326 and 328.

The machine-readable storage medium 320 may be any electronic, magnetic, optical, or other physical storage device that contains or stores executable instructions. Thus, the machine-readable storage medium 320 may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium 320 can be non-transitory. As described in detail below, machine-readable storage medium 320 may be encoded with a series of executable instructions for refreshing the row address if the counter threshold is exceeded.

Moreover, the instructions 322, 324, 326 and 328 when executed by a processor (e.g., via one processing element or multiple processing elements of the processor) can cause the processor to perform processes, such as, the process of FIG. 5. For example, the increment first counter instructions 322 may be executed by the processor 310 to increment a first counter (not shown) of a first row address of a table (not shown), if an activated row address adjacent to the first row address is not included in the table.

The increment second counter instructions 324 may be executed by the processor 310 to increment a second counter (not shown) of a second row address of the table, if the activated row address adjacent to the second row address is not included in the table. The activated row address may be between the first and second row addresses.

The refresh first row address instructions 326 may be executed by the processor 310 to refresh the first row address if the first counter exceeds a counter threshold. The refresh second row address instructions 328 may be executed by the processor 310 to refresh the second row address if the second counter exceeds the counter threshold. Additional instructions (not shown) may be executed by the processor 410 to reset the first counter if the first row address is refreshed and to reset the second counter if the second row address is refreshed.

Figure 4:
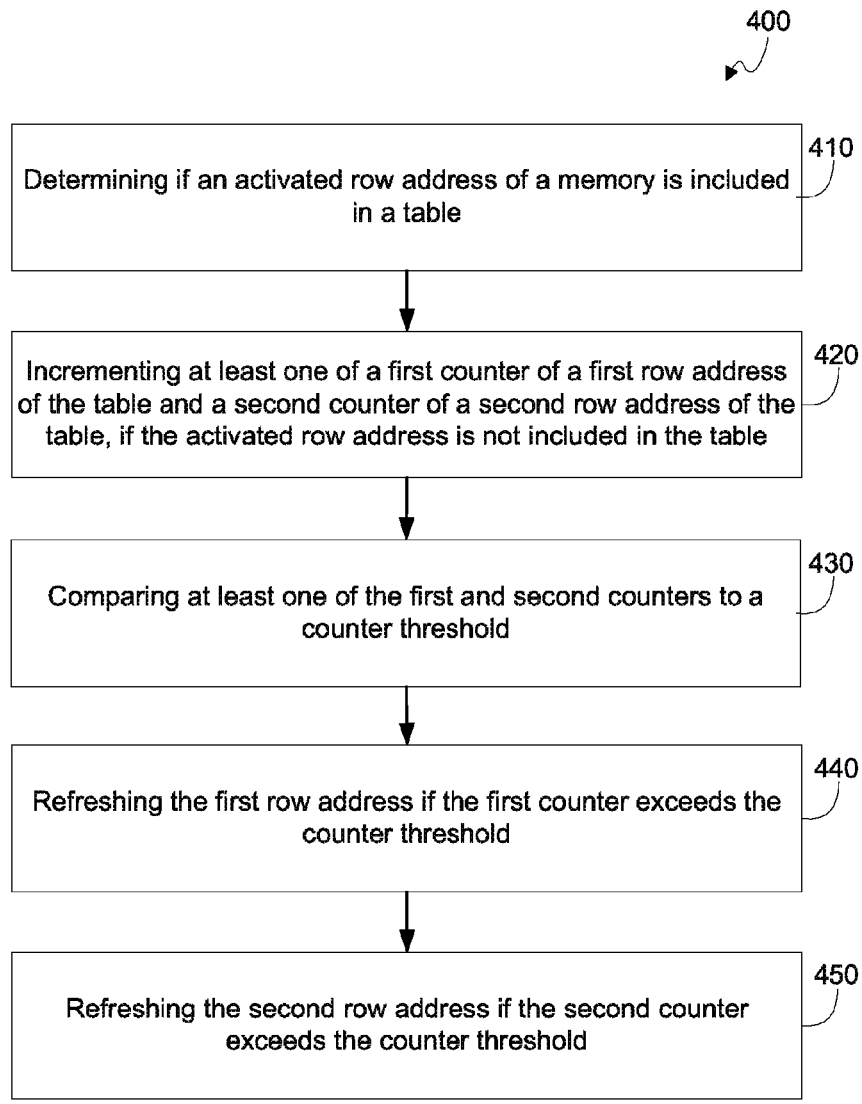
FIG. 4 is an example flowchart of a method for refreshing a row address if a counter threshold is exceeded.

FIG. 4 is an example flowchart of a method 400 for refreshing a row address if a counter threshold is exceeded. Although execution of the method 400 is described below with reference to the device 100, other suitable components for execution of the method 400 can be utilized, such as the device 200. Additionally, the components for executing the method 400 may be spread among multiple devices (e.g., a processing device in communication with input and output devices). In certain scenarios, multiple devices acting in coordination can be considered a single device to perform the method 400. The method 400 may be implemented in the form of executable instructions stored on a machine-readable storage medium, such as storage medium 320, and/or in the form of electronic circuitry.

At block 410, the device 100 determines if an activated row address of a memory is included in a table 110. Then, at block 420, the device 100 increments a first counter 122-1 of a first row address 112-1 of the table 110 and/or a second counter 122-2 of a second row address 112-2 of the table 110, if the activated row address is not included in the table 110. Next, at block 430, the device 100 compares the first and/or second counters 122-1 and 122-2 to a counter threshold 152.

At block 440, the device 100 refreshes the first row address 112-1 if the first counter 122-1 exceeds the counter threshold 152. At block 450, the device 100 refreshes the second row address 112-2 if the second counter 122-2 exceeds the counter threshold 152. The first and second row addresses 112-1 and 112-2 are adjacent to the activated row address at the memory.

FIGS. 5A to 5D is another example flowchart of a method 500 for refreshing a row address if a counter threshold is exceeded. Although execution of the method 500 is described below with reference to the device 200, other suitable components for execution of the method 500 can be utilized, such as the device 100. Additionally, the components for executing the method 500 may be spread among multiple devices (e.g., a processing device in communication with input and output devices). In certain scenarios, multiple devices acting in coordination can be considered a single device to perform the method 500. The method 500 may be implemented in the form of executable instructions stored on a machine-readable storage medium, such as storage medium 320, and/or in the form of electronic circuitry.

Starting with FIG. 5A, the method 500 starts at point A and flows to block 502 where the device 200 determines if an activated row address of a memory 250 is included in a table 110. If the activated row address 112-3 is included in the table 110, the device 200 resets a third counter 122-3 at block 504 and then sets a third LRU field 212-3 to a minimum value at block 506. Next, the method 500 flows to point D, as explained further below. On the other hand, if the activated row address is not included in the table 110, the method 500 flows from block 502 to block 508.

At block 508, the device 200 determines if the first row address 112-1 is included in the table 110. If the first row address 112-1 is included in the table 110, the method 500 flows to block 510, where the device 200 increments a first counter 122-1. Then, at block 512, the device 200 determines if the first counter 122-1 exceeds the counter threshold 152. If the first counter 122-1 exceeds the counter threshold 152, the method 500 flows to point E, as explained in further detail below. On the other hand, if the first counter 122-1 does not exceed the counter threshold 152, the method 500 flows to block 514, where the device 200 sets a first LRU field 212-1 to a maximum value, and then flows to point D.

Returning back to block 508, the device 200 determines if the first row address 112-1 is not included in the table 110, the method 500 flows to point B, as explained in greater detail below. Regardless of whether the first row address 112-1 is included in the table 110, the method 600 further flows to block 516, where the device 200 determines if the second row address 112-2 is included in the table 110.

If the second row address 112-2 is included in the table 110, the method 500 flows to block 518, where the device 200 increments a second counter 122-2. Then, at block 520, the device 200 determines if the second counter 122-2 exceeds the counter threshold 152. If the second counter 122-2 exceeds the counter threshold 152, the method 500 flows to point F, as explained in further detail below. On the other hand, if the second counter 122-2 does not exceed the counter threshold 152, the method 500 flows to block 522, where the device 200 sets a second LRU field 212-2 to then maximum value, and then flows to point D.

FIG. 5B illustrates a continuation from points B and C. As shown in FIG. 5A, when the first row address 112-1 is not included in the table 110, the method 500 flows to Point B, which then flows to block 524 of FIG. 5B. At block 524, the device 200 determines if the table 110 is full. If the table 110 is full, the method 500 flows to block 526, where the device 200 selects one of the plurality of row addresses 112-1 to 112-$n$ to remove from the table 110 based on a value of the plurality of counters 122-1 to 122-$n$ and the plurality of LRU fields 212-1 to 212-$n$. Each of the counters 122-1 to 122-$n$ corresponds to one of the row addresses 112-1 to 112-$n$ and each of the LRU fields 212-1 to 212-$n$ corresponds to one of the row addresses 112-1 to 112-$n$.

For example, the row address 112 having an LRU field 212 below the minimum value and a lowest value for its counter 122 may be selected to be removed. Next, the method 500 flows from block 526 to block 528. The method 500 similarly flows from block 524 to block 528, if the table 110 is not full. At block 528, the device 200 adds the first row address 112-1 to the table 110. Lastly, at block 530, the device 200 sets the first LRU 212-1 to the maximum value. The method 500 then flows to point D.

As shown in FIG. 5A, when the second row address 112-2 is not included in the table 110, the method 500 flows to Point C, which then flows to block 532 of FIG. 5B. At block 532, the device 200 determines if the table 110 is full. If the table 110 is full, the method 500 flows to block 534, where the device 200 selects one of the plurality of row addresses 112-1 to 112-$n$ to remove from the table 110 based on the value of the plurality of counters 122-1 to 122-$n$ and the plurality of LRU fields 212-1 to 212-$n$, as explained above.

Next, the method 500 flows from block 534 to block 536. The method 500 similarly flows from block 532 to block 536, if the table 110 is not full. At block 536, the device 200 adds the second row address 112-2 to the table 110. Lastly, at block 538, the device 200 sets the second LRU 212-2 to the maximum value. The method 500 then flows to point D.

Figure 5C:
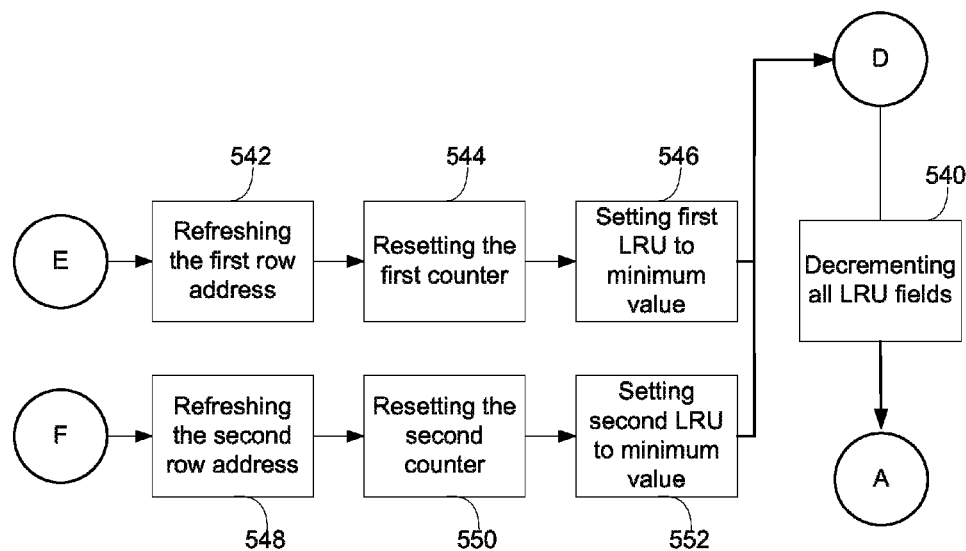

FIG. 5C illustrates a continuation from points D, E and F. Point D flows to block 540, where the device 200 decrements all of the plurality of LRU fields 2121-1 to 212-$n$. As shown in FIG. 5A, when the first counter 122-1 exceeds the counter threshold 152, the method 500 flows to point E, when then flows to block 542 of FIG. 5C. At block 542, the device 200 refreshes the first row address 112-1. Then, at block 544, the device 200 resets the first counter 122-1. Next, the device 200 sets the first LRU 212-1 to the minimum value. After, the method 500 flows to point D.

As shown in FIG. 5A, when the second counter 122-2 exceeds the counter threshold 152, the method 500 flows to point F, when then flows to block 548 of FIG. 5C. At block 548, the device 200 refreshes the second row address 112-2. Then, at block 550, the device 200 resets the second counter 122-2. Next, the device 200 sets the second LRU 212-2 to the minimum value. After, the method 500 flows to point D.

Figure 5D:
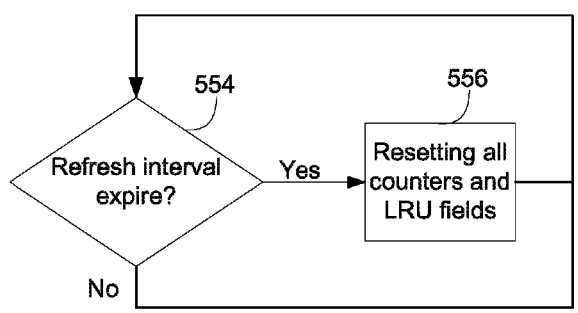

FIG. 5D illustrates a process occurring simultaneously with the process shown in FIGS. 5A to 5C. At block 554, the device 200 determines if a refresh interval 240 has expired. If the refresh interval 240 has expired, the device 200 resets all of the plurality of counters 122-1 to 122-$n$ and all of the plurality of LRU fields 212-1 to 212-$n$, at block 556. The method 500 then flows back to block 554, where the device 200 continues to wait for the next refresh interval 240 to expire.

I claim:

1. A device, comprising:
   a table to store a plurality of row addresses, including first and second row addresses, of a memory;
   a plurality of counters including first and second counters, each of the counters to correspond to one of the row addresses of the table;
   a row unit to determine if an activated row address of the memory is included in the table;
   a counter unit to increment at least one of the first counter of the first row address and the second counter of the second row address, if the activated row address is not included in the table; and
   a refresh unit to refresh at least one of the first and second row addresses if at least one of the first and second counters exceeds a counter threshold, wherein
   at least one the first and second row addresses are adjacent to the activated row address.

2. The device of claim 1, wherein,
   the refresh unit is to refresh the first row address and the counter unit is to reset the first counter to a minimum value, if the first counter exceeds the counter threshold, and
   the refresh unit is to refresh the second row address and the counter unit is to reset the second counter to the minimum value, if the second counter exceeds the counter threshold.

3. The device of claim 1, wherein the counter unit is to reset a third counter of the activated row address to a minimum value if the activated row address is included in the table.

4. The device of claim 1, wherein the counter unit is to add at least one of the first and second row addresses to the table, if the table does not include at least one of the first and second row addresses and the activated row address is not included in the table.

5. The device of claim 4, further comprising,
   a least recently used (LRU) unit to,
   set at least one of a first LRU field of the first row address and second LRU field of the second row address to a maximum value, if the activated row address is not included in the table,
   set at least one of the first and second LRU fields to a minimum value, if at one of the first and second row addresses is refreshed, and
   set a third LRU field of the activated row address to the minimum value, if the activated row address is included in the table.

6. The device of claim 5, further comprising:
   a replacement unit to select one of the plurality of row addresses to have a set replacement status if the selected row address is to have an LRU field less than the minimum value and to correspond to a counter having a lowest value of the plurality of counters, wherein,
   the LRU unit is to decrement all of the LRU fields each time a row address of the memory is to be activated.

7. The device of claim 6, wherein the replacement unit is to replace the row address of the table having the set replacement status with at least one of the first and second row addresses, if the table is full and at least one of the first and second row addresses is not included in the table.

8. The device of claim 6, wherein,
   all of the plurality of counters and LRU fields are to be reset at an end of a refresh interval,
   the activated row address is activated in response to an activate command, and
   at least one of the first and second rows are refreshed via a read command.

9. A method, comprising:
   determining if an activated row address of a memory is included in a table;
   incrementing at least one of a first counter of a first row address of the table and a second counter of a second row address of the table, if the activated row address is not included in the table;
   comparing at least one of the first and second counters to a counter threshold;
   refreshing the first row address if the first counter exceeds the counter threshold; and
   refreshing the second row address if the second counter exceeds the counter threshold, wherein
   the first and second row addresses are adjacent to the activated row address at the memory.

10. The method of claim 9, further comprising:
    resetting a third counter of the activated row address, if the activated row address is in included in the table; and
    resetting at least one of the first and second counters if at least one of the first and second row addresses is refreshed.

11. The method of claim 9, further comprising:
    adding at least one of the first and second row addresses to the table, if at least one of the first and second row addresses are not included in the table, wherein
    at least one of the row addresses of the table is removed, if the table is full and one of the first and row addresses is being added to the table, and
    the at least one removed row address to be selected based on a value of the counter and a least recently used (LRU) value of the removed row address.

12. The method of claim 11, further comprising:
    setting at least one of a first LRU field of the first row address and a second LRU field of the second row address to a minimum value, if at least one of the first and second row addresses is refreshed, and
    setting a third LRU field of the activated row address to the minimum value, if the activated row address is included in the table.

13. The method of claim 12, further comprising:
    decrementing all of the LRU fields each time a row address of the memory is activated;
    resetting all of the counters and all of the LRU fields, if a refresh interval expires;
    setting at least one of the first and second LRU fields to a maximum value after at least one of the first and second counters is incremented; and setting at least one of the first and second LRU fields to the maximum value if at least one of the first and second row addresses is added to the table.

14. A non-transitory computer-readable storage medium storing instructions that, if executed by a processor of a device, cause the processor to:

increment a first counter of a first row address of a table, if an activated row address adjacent to the first row address is not included in the table;

increment a second counter of a second row address of the table, if the activated row address adjacent to the second row address is not included in the table;

refresh the first row address if the first counter exceeds a counter threshold; and refresh the second row address if the second counter exceeds the counter threshold.

15. The non-transitory computer-readable storage medium of claim 14, further comprising instructions that, if executed by a processor of a device, cause the processor to, reset the first counter if the first row address is refreshed; and reset the second counter if the second row address is refreshed, wherein the activated row address is between the first and second row addresses.

* * * * *